US011217391B2

(12) United States Patent
Nagai et al.

(10) Patent No.: US 11,217,391 B2
(45) Date of Patent: Jan. 4, 2022

(54) ELECTRONIC COMPONENT

(71) Applicant: TDK CORPORATION, Tokyo (JP)

(72) Inventors: Yuichi Nagai, Tokyo (JP); Atsushi Takeda, Tokyo (JP); Takehisa Tamura, Tokyo (JP); Shinya Onodera, Tokyo (JP)

(73) Assignee: TDK CORPORATION, Tokyo (JP)

( * ) Notice: Subject to any disclaimer, the term of this patent is extended or adjusted under 35 U.S.C. 154(b) by 60 days.

(21) Appl. No.: 16/819,779

(22) Filed: Mar. 16, 2020

(65) Prior Publication Data

US 2020/0312551 A1 Oct. 1, 2020

(30) Foreign Application Priority Data

Mar. 25, 2019 (JP) .............................. JP2019-056110

(51) Int. Cl.
*H01G 4/005* (2006.01)
*H01G 4/30* (2006.01)
*H01G 4/12* (2006.01)
*H05K 3/34* (2006.01)
*H01G 4/232* (2006.01)

(52) U.S. Cl.
CPC .............. *H01G 4/005* (2013.01); *H01G 4/30* (2013.01); *H01G 4/12* (2013.01); *H01G 4/232* (2013.01); *H05K 3/34* (2013.01)

(58) Field of Classification Search
CPC .......... H01G 2/065; H01G 4/005; H01G 4/12; H01G 4/232; H01G 4/2325; H01G 4/30; H05K 3/3442; H05K 3/34; H05K 2201/10636; H05K 2201/10909

USPC ......... 361/306.3, 321.2, 301.4, 321.5, 321.4; 174/60

See application file for complete search history.

(56) References Cited

U.S. PATENT DOCUMENTS

| 6,381,117 B1* | 4/2002 | Nakagawa | H01G 2/14 |
| | | | 361/306.3 |
| 2011/0193448 A1* | 8/2011 | Saruban | H01G 4/005 |
| | | | 310/311 |
| 2016/0276104 A1 | 9/2016 | Nishisaka et al. | |
| 2017/0098506 A1* | 4/2017 | Ando | H01G 4/232 |
| 2017/0186538 A1* | 6/2017 | Ando | H01G 4/30 |
| 2018/0151296 A1* | 5/2018 | Yamada | H01G 4/30 |

(Continued)

FOREIGN PATENT DOCUMENTS

| CN | 110098050 A | 8/2019 |
| JP | 3376970 B2 | 2/2003 |

(Continued)

*Primary Examiner* — Timothy J Thompson
*Assistant Examiner* — Guillermo J Egoavil
(74) *Attorney, Agent, or Firm* — Oliff PLC

(57) ABSTRACT

An electronic component includes an element body and an external electrode disposed on the element body. The element body includes a principal surface arranged to constitute a mounting surface and an end surface adjacent to the principal surface. The external electrode includes a conductive resin layer disposed to continuously cover a part of the principal surface and a part of the end surface, and a plating layer covering the conductive resin layer. The conductive resin layer includes a first region positioned on the end surface and a second region positioned on the principal surface. A maximum thickness of the second region is larger than a maximum thickness of the first region.

13 Claims, 10 Drawing Sheets

(56) References Cited

U.S. PATENT DOCUMENTS

| | | |
|---|---|---|
| 2018/0268998 A1 | 9/2018 | Onodera et al. |
| 2019/0237259 A1 | 8/2019 | Onodera et al. |
| 2019/0378654 A1 | 12/2019 | Yamada |

FOREIGN PATENT DOCUMENTS

| | | |
|---|---|---|
| JP | 2017-120819 A | 7/2017 |
| JP | 2018-088451 A | 6/2018 |
| JP | 2018-157029 A | 10/2018 |
| KR | 10-2016-0113038 A | 9/2016 |

\* cited by examiner

ELECTRONIC COMPONENT

BACKGROUND OF THE INVENTION

1. Field of the Invention

The present invention relates to an electronic component.

2. Description of Related Art

Known electronic components include an element body and an external electrode disposed on the element body (for example, refer to Japanese Unexamined Patent Publication No. 2018-157029). The element body includes a principal surface arranged to constitute a mounting surface and an end surface adjacent to the principal surface. The external electrode includes a conductive resin layer disposed to continuously cover a part of the principal surface and a part of the end surface, and a plating layer covering the conductive resin layer.

SUMMARY OF THE INVENTION

The conductive resin layer generally contains a resin and electrically-conductive particles. The resin tends to absorb moisture. In a case in which the electronic component is solder-mounted on an electronic device, the moisture absorbed by the resin may be gasified so that volume expansion may occur. In this case, stress may act on the conductive resin layer, and the conductive resin layer may be cracked and be peeled off. The electrically-conductive particles include, for example, metal. The electronic device includes, for example, a circuit board or an electronic component.

An object of an aspect of the present invention is to provide an electronic component that controls peel-off of a conductive resin layer reliably.

An electronic component according to an aspect of the present invention includes an element body and an external electrode disposed on the element body. The element body includes a principal surface arranged to constitute a mounting surface and an end surface adjacent to the principal surface. The external electrode includes a conductive resin layer disposed to continuously cover a part of the principal surface and a part of the end surface, and a plating layer covering the conductive resin layer. The conductive resin layer includes a first region positioned on the end surface and a second region positioned on the principal surface. A maximum thickness of the second region is larger than a maximum thickness of the first region.

As a result of research and study by the present inventors, the present inventors have discovered the following matters.

The plating layer covering the conductive resin layer tends to be in cohesive contact with the conductive resin layer, but tends not to be in cohesive contact with the element body. Therefore, a gap is formed between an end edge of the plating layer and the element body. In a case where the moisture absorbed by the resin is gasified, the gas generated from the moisture reaches the gap between the end edge of the plating layer and the element body, and the gas is emitted outside the external electrode through the gap. Since the gas generated from the moisture is emitted outside the external electrode, stress tends not to act on the conductive resin layer. Hereinafter, the gap between the end edge of the plating layer and the element body is referred to as a "gap" simply.

The second region of the conductive resin layer is close to the gap, and thus the gas generated from the moisture absorbed by the resin of the second region tends to reach the gap. Since the first region is away from the gap, the gas generated from the moisture absorbed by the resin of the first region tends not to reach the gap. Therefore, in order to emit, outside the external electrode, the gas generated from the moisture absorbed by the resin of the first region, it is desired to achieve a configuration in which the gas generated from the moisture absorbed by the resin of the first region reaches the gap reliably. In a case in which the gas generated from the moisture absorbed by the resin of the first region reaches the gap reliably, the gas generated from the moisture absorbed by the resin of the second region also reaches the gap reliably.

The inventors focused on a path through which the gas generated from the moisture absorbed by the resin of the first region reaches the gap. Consequently, the inventors found out that the gas generated from the moisture absorbed by the resin of the first region reaches the gap reliably in a configuration where the maximum thickness of the second region is larger than the maximum thickness of the first region. The gas generated from the moisture absorbed by the resin of the first region tends to move in the second region in the configuration where the maximum thickness of the second region is larger than the maximum thickness of the first region.

Therefore, in the above-described aspect, the gas generated from the moisture absorbed by the resin of the conductive resin layer (the first region) reaches the gap reliably. The gas that has reached the gap is emitted outside the external electrode, so that the stress tends not to act on the conductive resin layer. Consequently, the above-described aspect controls the peel-off of the conductive resin layer reliably.

In the above-described aspect, the conductive resin layer may include a third region positioned on a ridge portion between the end surface and the principal surface. A minimum thickness of the third region may be smaller than the maximum thickness of the first region.

As a result of research and study by the present inventors, the present inventors also have discovered the following matters.

The gap is an outlet of the gas generated from the moisture absorbed by the resin of the conductive resin layer, and is also an inlet of moisture to the external electrode. The path through which the gas generated from the moisture absorbed by the resin of the first region reaches the gap may serve as a path through which the moisture reaches the first region. The moisture that has reached the first region is absorbed in the first region. In this case, the gas generation amount may increase. Therefore, in order to reduce the absorption of the moisture in the first region, it is desired to achieve a configuration in which the moisture tends not to reach the first region.

The inventors found out that the moisture tends not to reach the first region in a configuration where the minimum thickness of the third region is smaller than the maximum thickness of the first region. The moisture tends not to pass through the third region in the configuration where the minimum thickness of the third region is smaller than the maximum thickness of the first region. Therefore, this configuration reduces an increase in moisture absorbed in the conductive resin layer (the first region) and an increase in gas generated from the moisture. Consequently, this configuration controls the peel-off of the conductive resin layer more reliably.

In the aspect described above, the element body may include a side surface that is adjacent to the principal surface and the end surface. The conductive resin layer may be disposed to also cover a part of the side surface continuously, and may include a fourth region positioned on the side surface. A maximum thickness of the fourth region may be smaller than the maximum thickness of the first region.

In a configuration where the maximum thickness of the fourth region is smaller than the maximum thickness of the first region, the gas generated from the moisture absorbed by the resin of the first region tends not to pass through the fourth region. Therefore, the gas generated from the moisture absorbed by the resin of the first region passes through the second region to reach the gap more reliably. Consequently, this configuration controls a position from which the gas is emitted.

Since the fourth region is closer to the gap than to the first region, the fourth region may serve as a path through which the moisture reaches the first region. In contrast, in the configuration where the maximum thickness of the fourth region is smaller than the maximum thickness of the first region, the moisture tends not to pass through the fourth region even in a case in which the moisture enters the fourth region. Therefore, even in a case in which the conductive resin layer includes the fourth region, this configuration reduces an increase in moisture absorbed in the conductive resin layer (the first region) and an increase in gas generated from the moisture. Consequently, this configuration controls the peel-off of the conductive resin layer more reliably.

In the above-described aspect, in a cross-section orthogonal to the principal surface and the end surface, a surface of the second region may curve in a convex shape in a direction away from the principal surface.

In this configuration, since the thickness of the second region tends not to be small locally, a movement path of the gas in the second region tends not to be narrow on the movement path. Therefore, this configuration tends not to suppress the movement of the gas in the second region. The gas generated from the moisture absorbed by the resin of the conductive resin layer reaches the gap more reliably. Consequently, this configuration controls the peel-off of the conductive resin layer more reliably.

In the above-described aspect, when viewed from a direction orthogonal to the principal surface, an end edge of the second region may curve.

In this configuration, the length of the end edge of the second region is larger than that of a configuration in which the end edge of the second region has a linear shape. Therefore, in this configuration, a region from which the gas is emitted is large, and the gas further tends to be emitted from the external electrode. Consequently, the stress further tends not to act on the conductive resin layer.

The present invention will become more fully understood from the detailed description given hereinafter and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating embodiments of the invention, are given by way of illustration only, since various changes and modifications within the spirit and scope of the invention will become apparent to those skilled in the art from this detailed description.

DETAILED DESCRIPTION OF EMBODIMENTS

Figure 1:
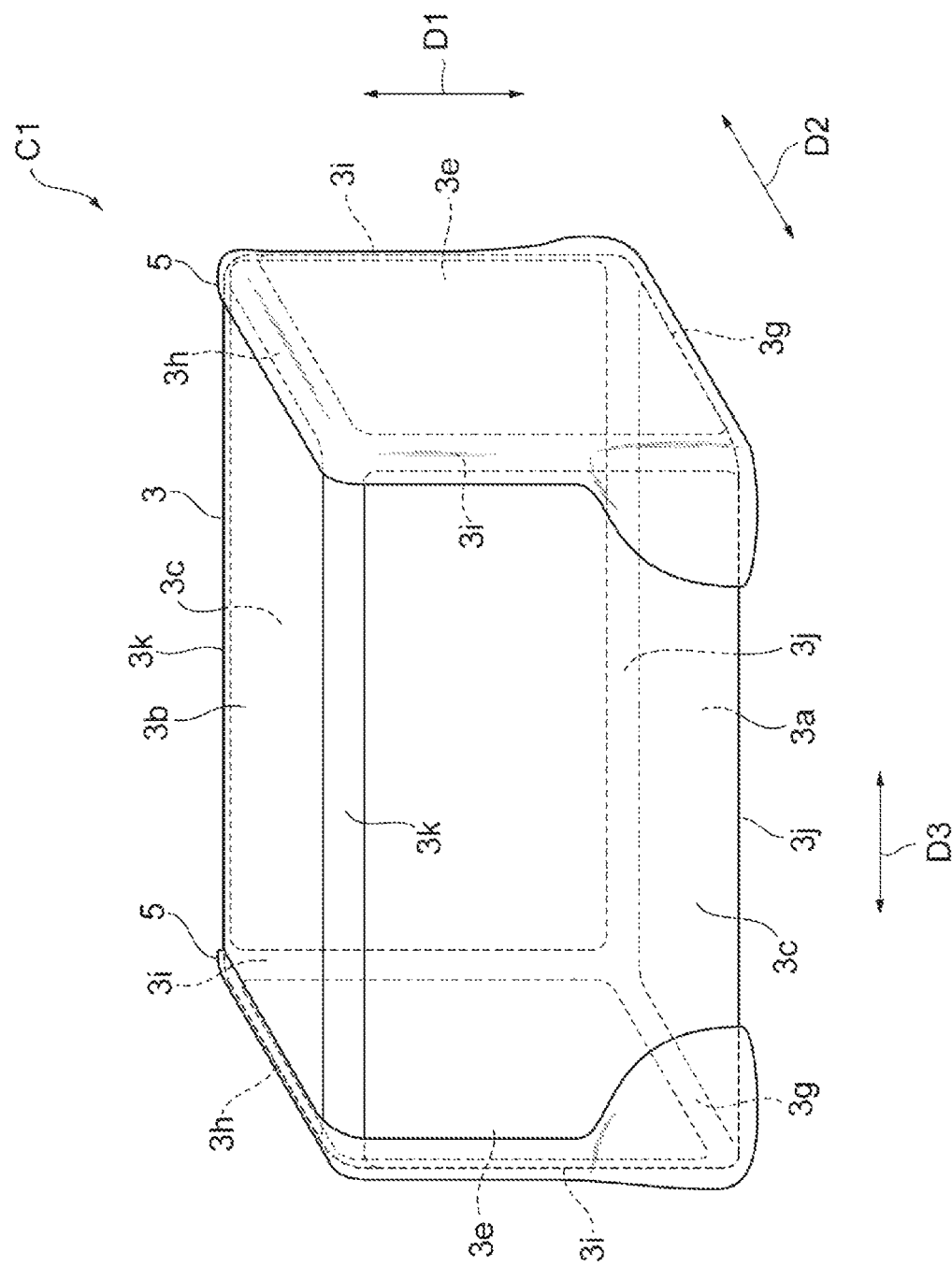
FIG. 1 is a perspective view of a multilayer capacitor according to an embodiment.

Hereinafter, embodiments of the present invention will be described in detail with reference to the accompanying drawings. In the following description, the same elements or elements having the same functions are denoted with the same reference numerals and overlapped explanation is omitted.

Figure 2:
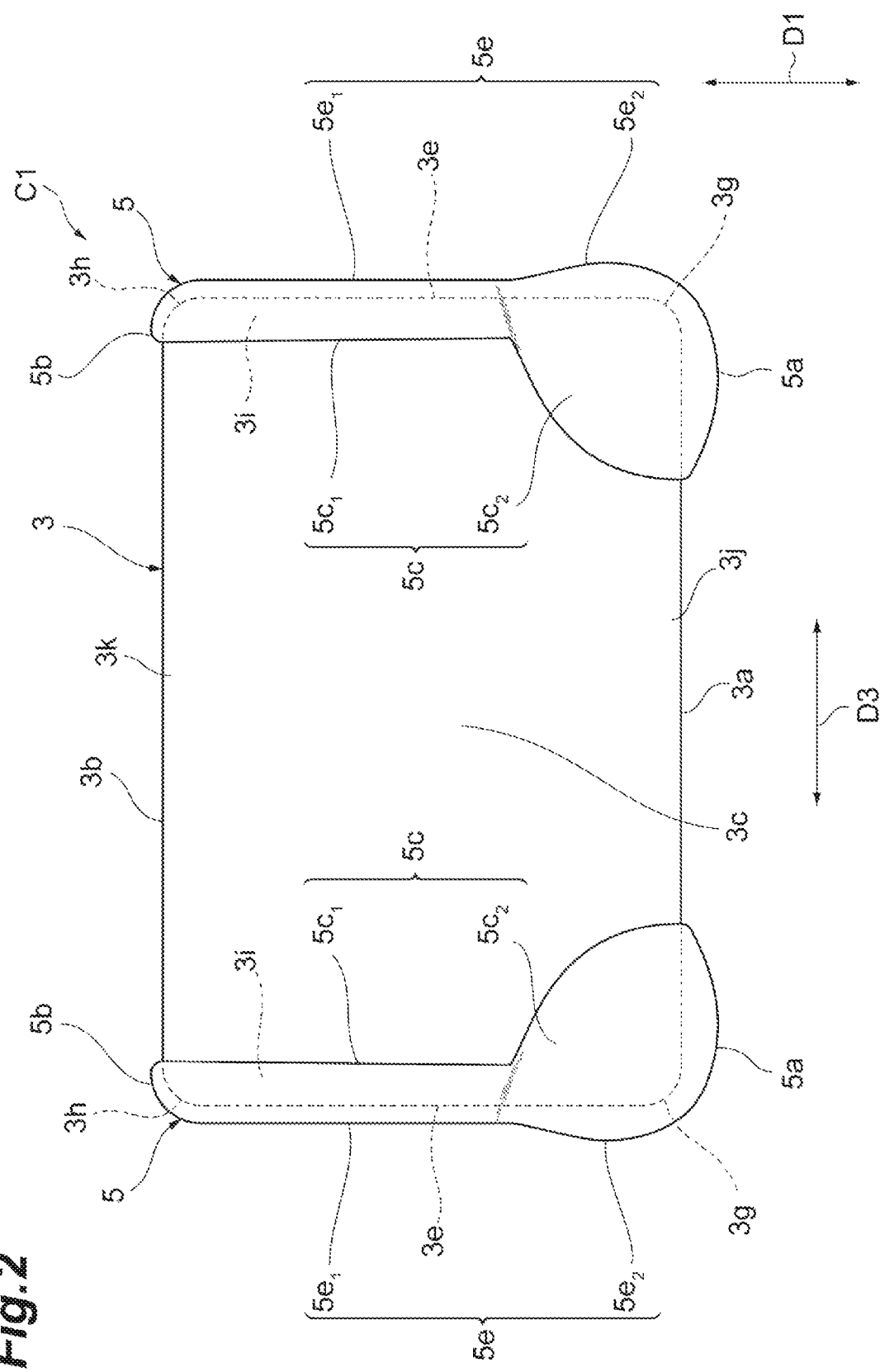
FIG. 2 is a side view of the multilayer capacitor according to the embodiment.
Figure 3:
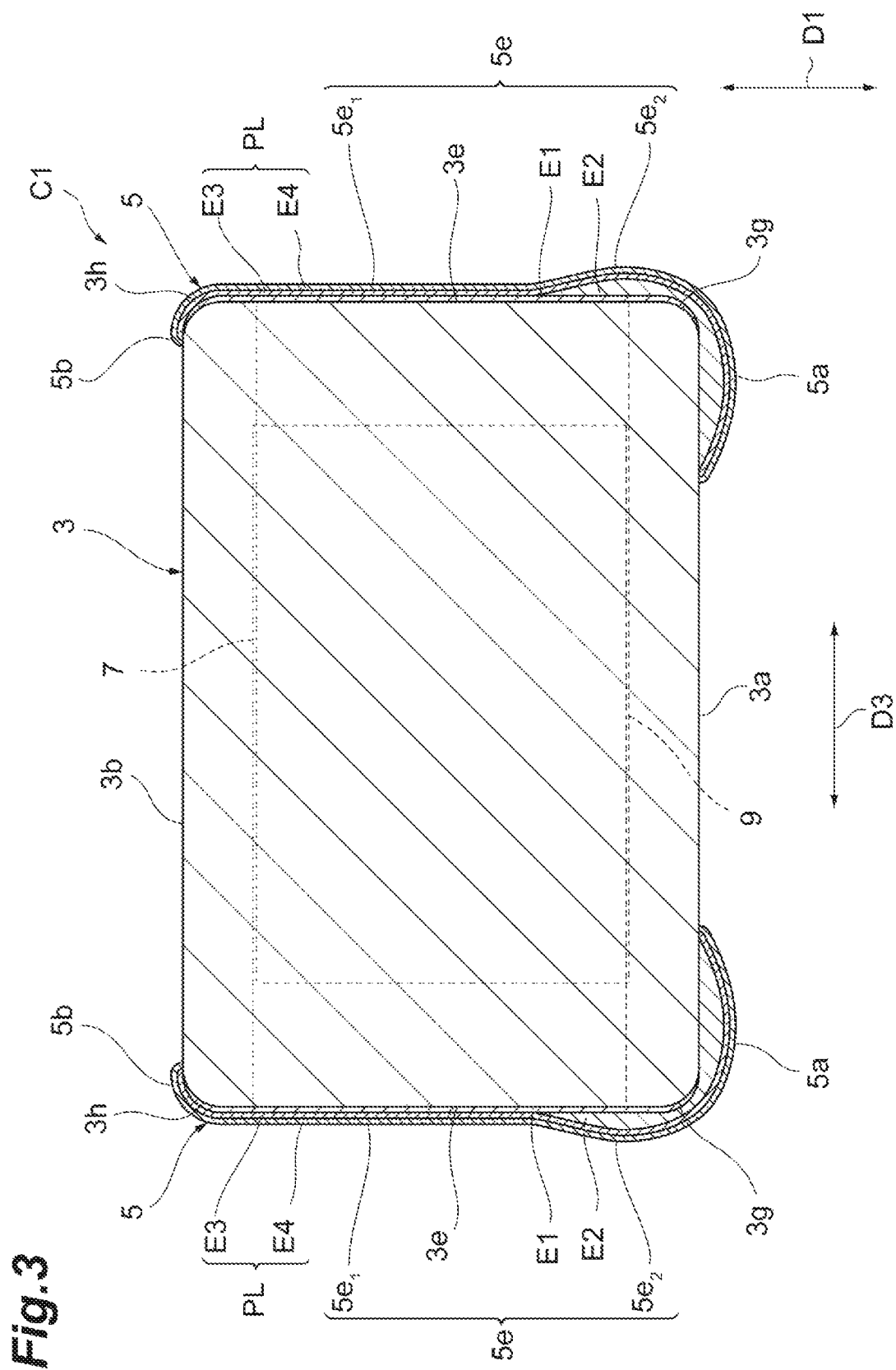
FIG. 3 is a view illustrating a cross-sectional configuration of the multilayer capacitor according to the embodiment.
Figure 4:
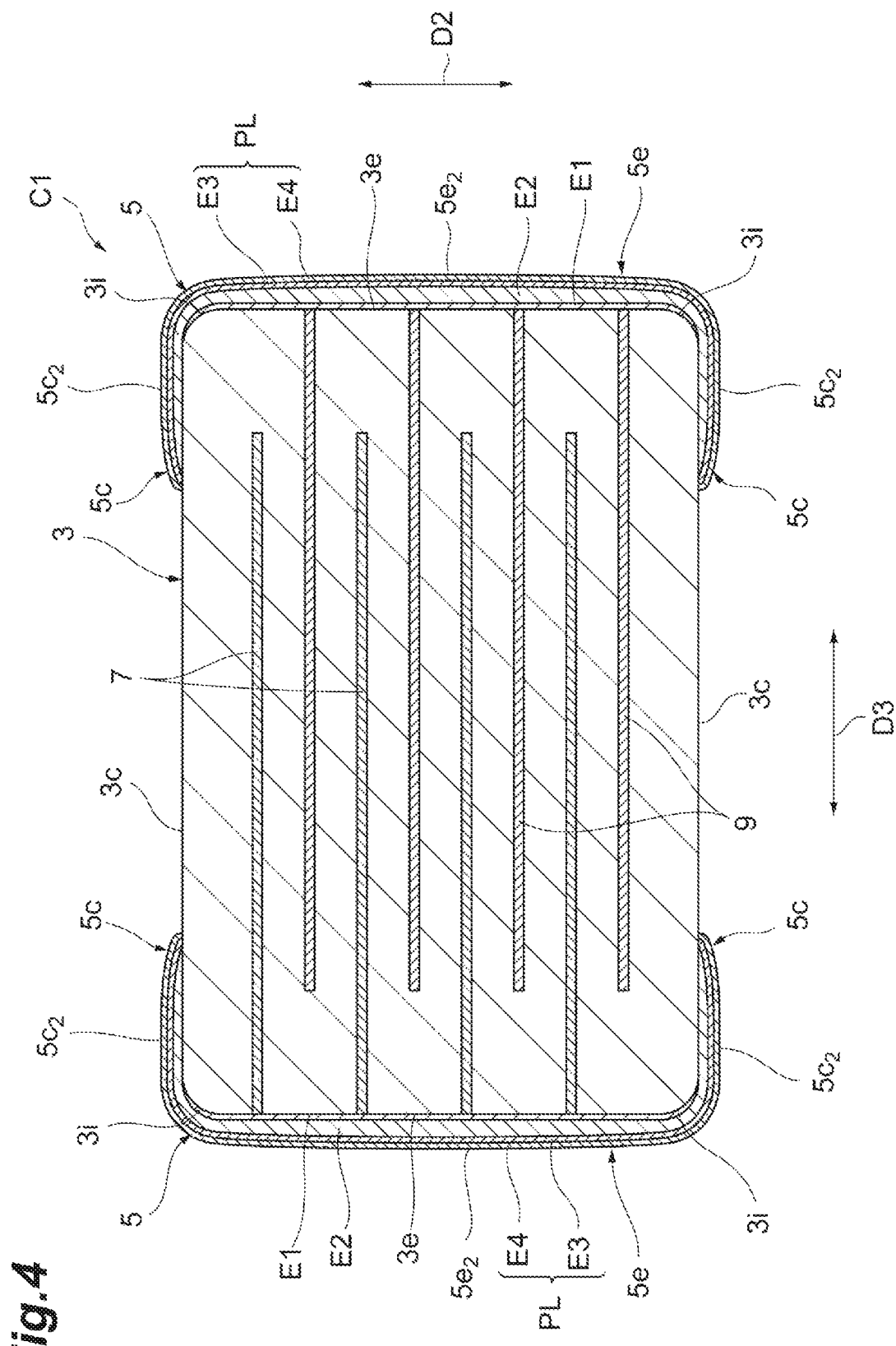
FIG. 4 is a view illustrating a cross-sectional configuration of the multilayer capacitor according to the embodiment.
Figure 5:
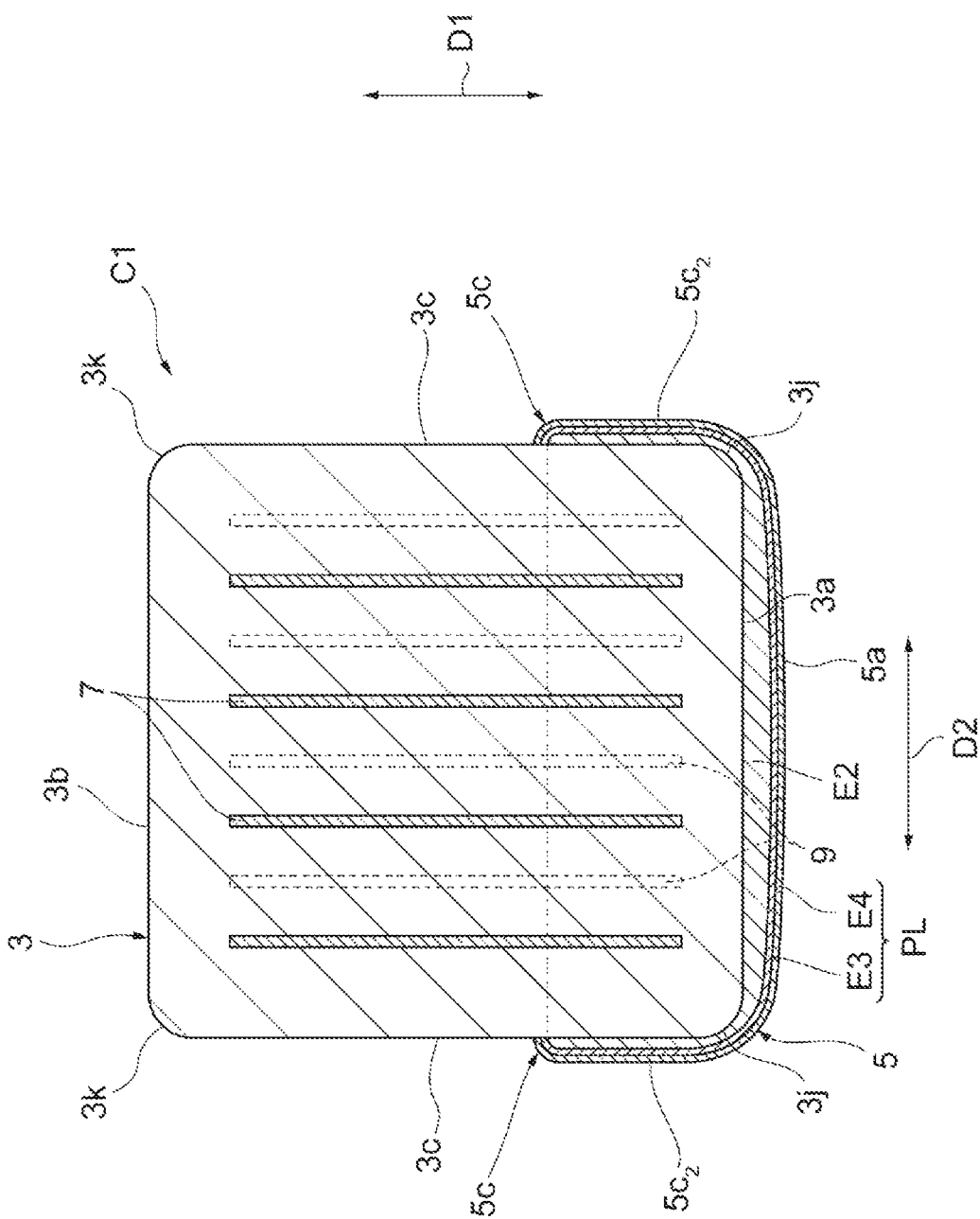
FIG. 5 is a view illustrating a cross-sectional configuration of the multilayer capacitor according to the embodiment.
Figure 6:
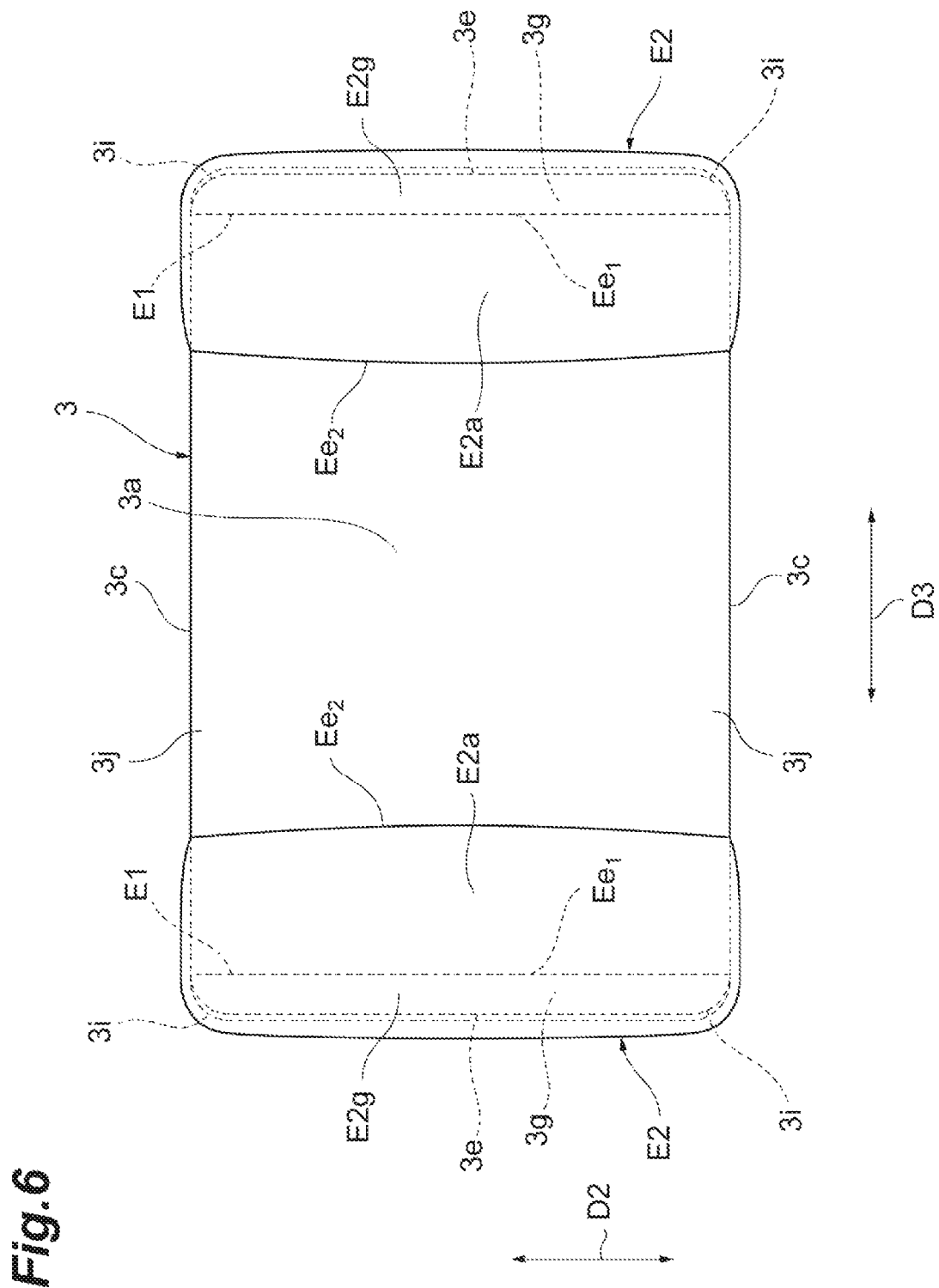
FIG. 6 is a plan view illustrating an element body, a first electrode layer, and a second electrode layer.
Figure 7:
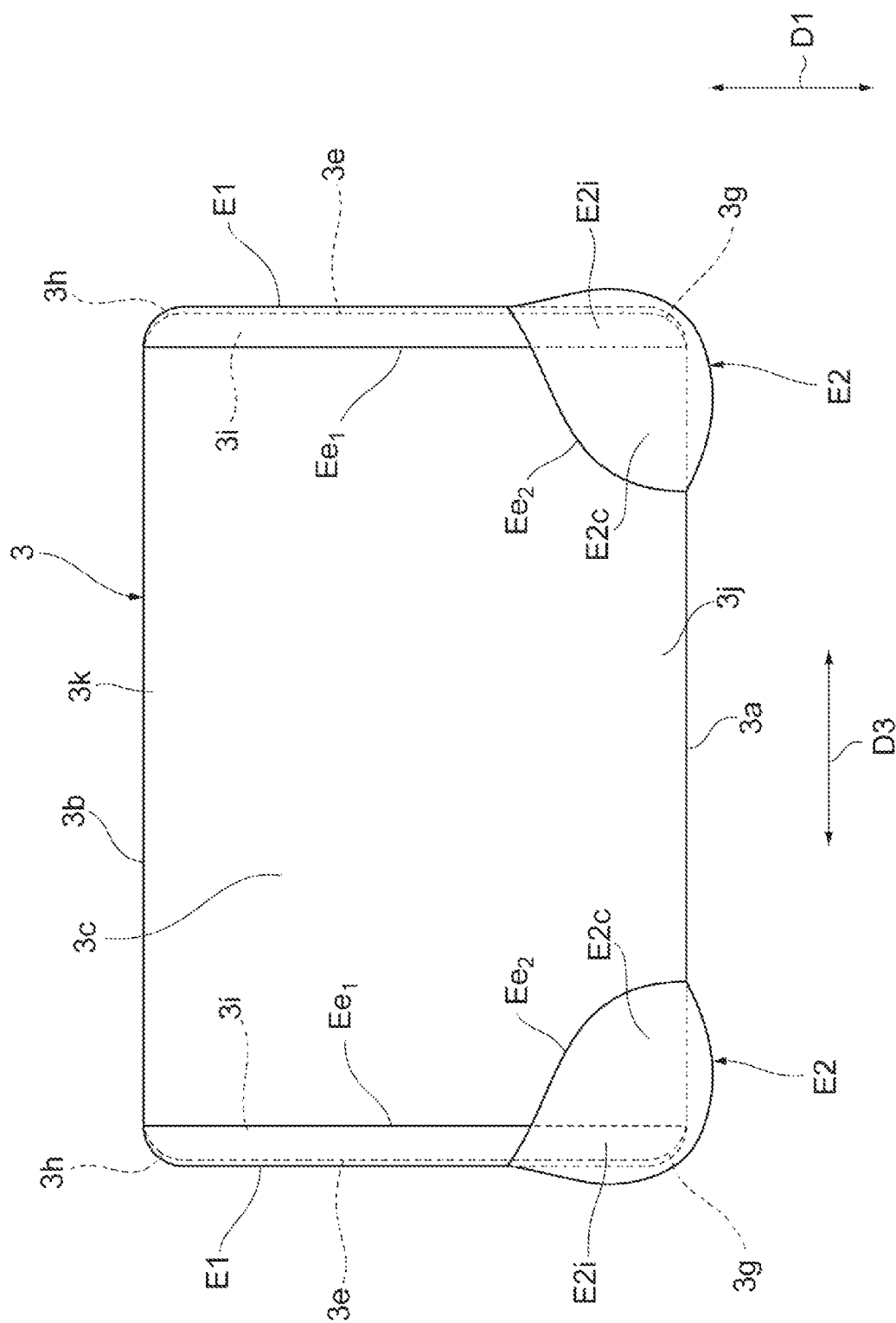
FIG. 7 is a side view illustrating the element body, the first electrode layer, and the second electrode layer.
Figure 8:
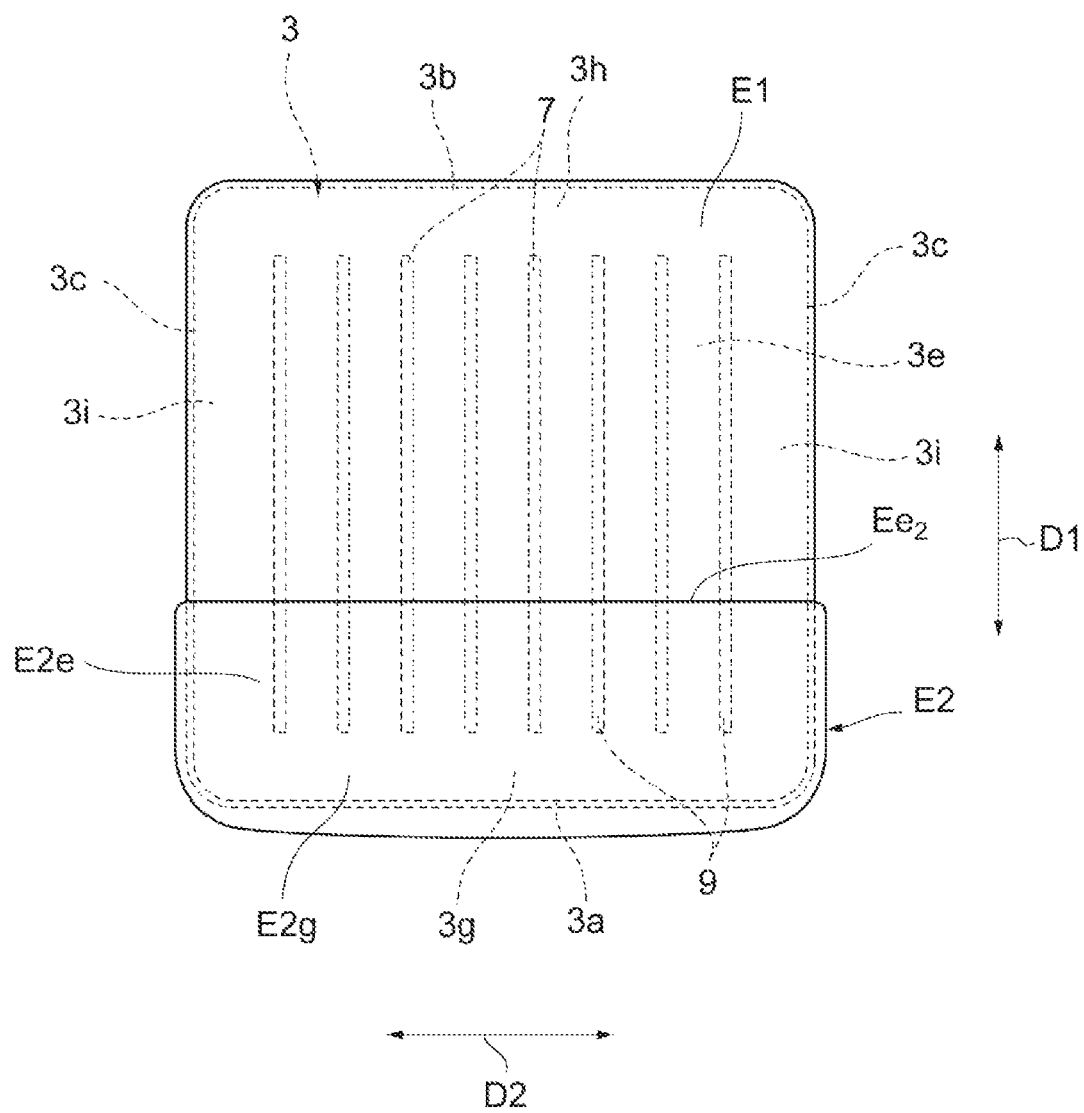
FIG. 8 is an end view illustrating the element body, the first electrode layer, and the second electrode layer.
Figure 9:
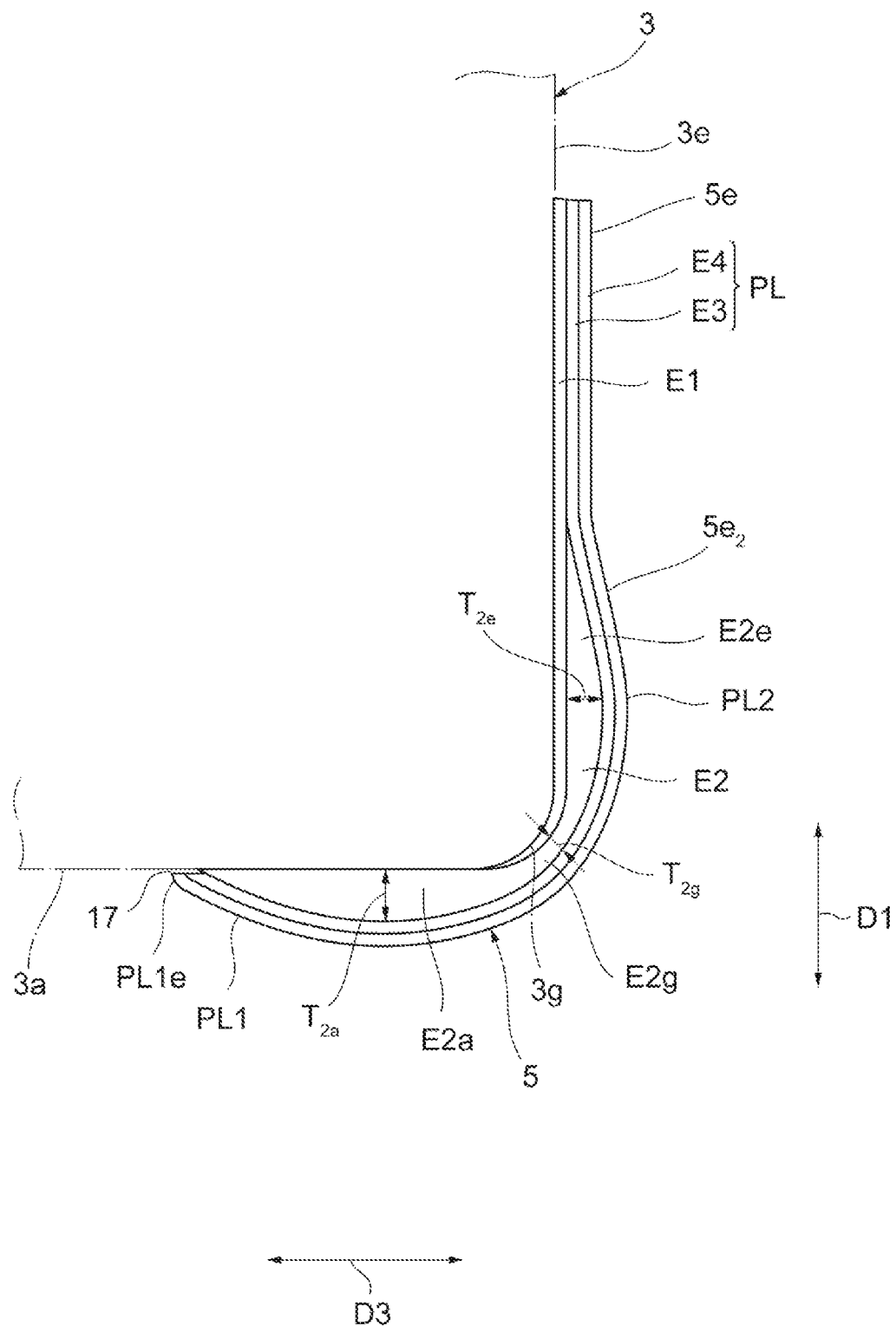
FIG. 9 is a view illustrating a cross-sectional configuration of an external electrode.
Figure 10:
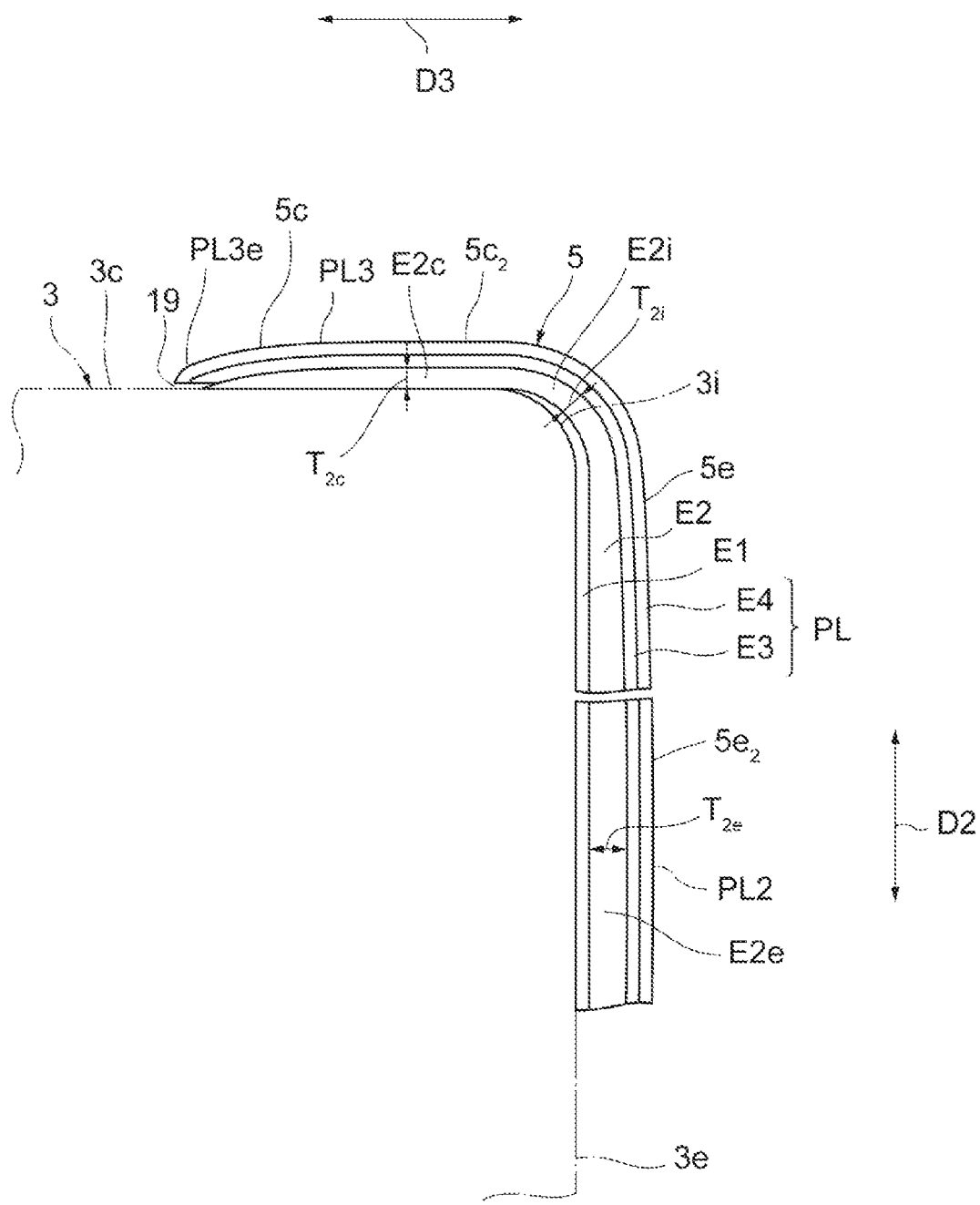
FIG. 10 is a view illustrating a cross-sectional configuration of an external electrode.

A configuration of a multilayer capacitor C1 according to an embodiment will be described with reference to FIGS. 1 to 10. FIG. 1 is a perspective view of a multilayer capacitor according to the embodiment. FIG. 2 is a side view of the multilayer capacitor according to the embodiment. FIGS. 3 to 5 are views illustrating a cross-sectional configuration of the multilayer capacitor according to the embodiment. FIG. 6 is a plan view illustrating an element body, a first electrode layer, and a second electrode layer. FIG. 7 is a side view illustrating the element body, the first electrode layer, and the second electrode layer. FIG. 8 is an end view illustrating the element body, the first electrode layer, and the second electrode layer. FIGS. 9 and 10 are views illustrating a cross-sectional configuration of an external electrode. In the present embodiment, an electronic component is, for example, the multilayer capacitor C1.

As illustrated in FIG. 1, the multilayer capacitor C1 includes an element body 3 of a rectangular parallelepiped shape and a plurality of external electrodes 5. In the present embodiment, the multilayer capacitor C1 includes a pair of external electrodes 5. The pair of external electrodes 5 is disposed on the element body 3. The pair of external electrodes 5 is separated from each other. The rectangular parallelepiped shape includes a rectangular parallelepiped shape in which corners and ridges are chamfered, and a rectangular parallelepiped shape in which the corners and ridges are rounded.

The element body 3 includes a pair of principal surfaces $3a$ and $3b$ opposing each other, a pair of side surfaces $3c$ opposing each other, and a pair of end surfaces $3e$ opposing each other. The pair of principal surfaces $3a$ and $3b$, the pair of side surfaces $3c$, and the pair of end surfaces $3e$ have a rectangular shape. The direction in which the pair of principal surfaces $3a$ and $3b$ opposes each other is a first direction D1. The direction in which the pair of side surfaces $3c$ opposes each other is a second direction D2. The direction in which the pair of end surfaces $3e$ opposes each other is a third direction D3. The multilayer capacitor C1 is solder-mounted on an electronic device. The electronic device includes, for example, a circuit board or an electronic component. The principal surface 3a of the multilayer capacitor C1 opposes the electronic device. The principal surface 3a is arranged to constitute a mounting surface. The principal surface 3a is the mounting surface.

The first direction D1 is a direction orthogonal to the respective principal surfaces 3a and 3b and is orthogonal to the second direction D2. The third direction D3 is a direction parallel to the respective principal surfaces 3a and 3b and the respective side surfaces 3c, and is orthogonal to the first direction D1 and the second direction D2. The second direction D2 is a direction orthogonal to the respective side surfaces 3c. The third direction D3 is a direction orthogonal to the respective end surfaces 3e. In the present embodiment, a length of the element body 3 in the third direction D3 is larger than a length of the element body 3 in the first direction D1, and larger than a length of the element body 3 in the second direction D2. The third direction D3 is a longitudinal direction of the element body 3. The length of the element body 3 in the first direction D1 and the length of the element body 3 in the second direction D2 may be equivalent to each other. The length of the element body 3 in the first direction D1 and the length of the element body 3 in the second direction D2 may be different from each other.

The length of the element body 3 in the first direction D1 is a height of the element body 3. The length of the element body 3 in the second direction D2 is a width of the element body 3. The length of the element body 3 in the third direction D3 is a length of the element body 3. In the present embodiment, the element body 3 has a height of 0.5 to 2.5 mm, a width of 0.5 to 5.0 mm, and a length of 1.0 to 5.7 mm. The element body 3 has, for example, a height of 2.5 mm, a width of 2.5 mm, and a length of 3.2 mm.

The pair of side surfaces 3c extends in the first direction D1 to couple the pair of principal surfaces 3a and 3b. The pair of side surfaces 3c also extends in the third direction D3. The pair of end surfaces 3e extends in the first direction D1 to couple the pair of principal surfaces 3a and 3b. The pair of end surfaces 3e extends in the second direction D2.

The element body 3 includes a pair of ridge portions 3g, a pair of ridge portions 3h, four ridge portions 3i, a pair of ridge portions 3j, and a pair of ridge portions 3k. The ridge portion 3g is positioned between the end surface 3e and the principal surface 3a. The ridge portion 3h is positioned between the end surface 3e and the principal surface 3b. The ridge portion 3i is positioned between the end surface 3e and the side surface 3c. The ridge portion 3j is positioned between the principal surface 3a and the side surface 3c. The ridge portion 3k is positioned between the principal surface 3b and the side surface 3c. In the present embodiment, each of the ridge portions 3g, 3h, 3i, 3j, and 3k is rounded to curve. The element body 3 is subject to what is called a round chamfering process.

The end surface 3e and the principal surface 3a are indirectly adjacent to each other with the ridge portion 3g between the end surface 3e and the principal surface 3a. The end surface 3e and the principal surface 3b are indirectly adjacent to each other with the ridge portion 3h between the end surface 3e and the principal surface 3b. The end surface 3e and the side surface 3c are indirectly adjacent to each other with the ridge portion 3i between the end surface 3e and the side surface 3c. The principal surface 3a and the side surface 3c are indirectly adjacent to each other with the ridge portion 3j between the principal surface 3a and the side surface 3c. The principal surface 3b and the side surface 3c are indirectly adjacent to each other with the ridge portion 3k between the principal surface 3b and the side surface 3c.

The element body 3 is configured by laminating a plurality of dielectric layers in the second direction D2. The element body 3 includes the plurality of laminated dielectric layers. In the element body 3, a lamination direction of the plurality of dielectric layers coincides with the second direction D2. Each dielectric layer includes, for example, a sintered body of a ceramic green sheet containing a dielectric material. The dielectric material includes, for example, a dielectric ceramic of $BaTiO_3$ base, $Ba(Ti,Zr)O_3$ base, or $(Ba,Ca)TiO_3$ base. In an actual element body 3, each of the dielectric layers is integrated to such an extent that a boundary between the dielectric layers cannot be visually recognized. In the element body 3, the lamination direction of the plurality of dielectric layers may coincide with the first direction D1.

As illustrated in FIGS. 3 to 5, the multilayer capacitor C1 includes a plurality of internal electrodes 7 and a plurality of internal electrodes 9. Each of the internal electrodes 7 and 9 is an internal conductor disposed in the element body 3. Each of the internal electrodes 7 and 9 is made of a conductive material that is commonly used as an internal conductor of a multilayer electronic component. The conductive material includes, for example, a base metal. The conductive material includes, for example, Ni or Cu. Each of the internal electrodes 7 and 9 is configured as a sintered body of conductive paste containing the conductive material described above. In the present embodiment, the internal electrodes 7 and 9 are made of Ni.

The internal electrodes 7 and the internal electrodes 9 are disposed in different positions (layers) in the second direction D2. The internal electrodes 7 and the internal electrodes 9 are alternately disposed in the element body 3 to oppose each other in the second direction D2 with an interval therebetween. Polarities of the internal electrodes 7 and the internal electrodes 9 are different from each other. In a case in which the lamination direction of the plurality of dielectric layers is the first direction D1, the internal electrodes 7 and the internal electrodes 9 are disposed in different positions (layers) in the first direction D1. One end of each of the internal electrodes 7 and 9 is exposed to a corresponding end surface 3e of the pair of the end surfaces 3e. Each of the internal electrodes 7 and 9 includes the one end exposed to the corresponding end surface 3e.

The plurality of internal electrodes 7 and the plurality of internal electrodes 9 are alternately disposed in the second direction D2. The internal electrodes 7 and 9 are positioned in a plane approximately parallel to the side surfaces 3c. The internal electrodes 7 and the internal electrodes 9 oppose each other in the second direction D2. The direction (second direction D2) in which the internal electrodes 7 and the internal electrodes 9 oppose each other is orthogonal to the direction (first direction D1 and third direction D3) parallel to the side surfaces 3c. In a case in which the lamination direction of the plurality of dielectric layers is the first direction D1, the plurality of internal electrodes 7 and the plurality of internal electrodes 9 are alternately disposed in the first direction D1. In this case, the internal electrodes 7 and 9 are positioned in a plane approximately parallel to the principal surfaces 3a and 3b. The internal electrodes 7 and the internal electrodes 9 oppose each other in the first direction D1.

As illustrated in FIG. 1, the external electrodes 5 are disposed at both end portions of the element body 3 in the third direction D3. Each of the external electrodes 5 is disposed on the corresponding end surface 3e side of the element body 3. The external electrode 5 is disposed on at least the principal surface 3a and end surface 3e adjacent to each other. As illustrated in FIGS. 2 to 5, the external electrode 5 includes a plurality of electrode portions 5a, 5b, 5c, and 5e. The electrode portion 5a is disposed on the principal surface 3a and the ridge portion 3g. The electrode portion 5b is disposed on the ridge portion 3h. The electrode portion 5c is disposed on each side surface 3c and each ridge portion 3i. The electrode portion 5e is disposed on the corresponding end surface 3e. The external electrode 5 also includes electrode portions disposed on the ridge portions 3j. Each of the external electrodes 5 is disposed on at least the end surface 3e.

The external electrode 5 is formed on the four surfaces, that is, the principal surface 3a, the end surface 3e, and the pair of side surfaces 3c, as well as on the ridge portions 3g, 3h, 3i, and 3j. The electrode portions 5a, 5b, 5c, and 5e adjacent each other are coupled and are electrically connected to each other. Each electrode portion 5e covers all the one ends of the corresponding internal electrodes 7 or 9. The electrode portion 5e is directly connected to the corresponding internal electrodes 7 or 9. The external electrode 5 is electrically connected to the corresponding internal electrodes 7 or 9. As illustrated in FIGS. 3 to 5, the external electrode 5 includes a first electrode layer E1, a second electrode layer E2, a third electrode layer E3, and a fourth electrode layer E4. The fourth electrode layer E4 is arranged to constitute the outermost layer of the external electrode 5. Each of the electrode portions 5a, 5c, and 5e includes the first electrode layer E1, the second electrode layer E2, the third electrode layer E3, and the fourth electrode layer E4. The electrode portion 5b includes the first electrode layer E1, the third electrode layer E3, and the fourth electrode layer E4.

The first electrode layer E1 included in the electrode portion 5a is disposed on the ridge portion 3g, and is not disposed on the principal surface 3a. The first electrode layer E1 included in the electrode portion 5a is formed to cover the entire ridge portion 3g. The first electrode layer E1 is not formed on the principal surface 3a. The first electrode layer E1 included in the electrode portion 5a is in contact with the entire ridge portion 3g. The principal surface 3a is not covered with the first electrode layer E1, and is exposed from the first electrode layer E1. The first electrode layer E1 included in the electrode portion 5a may be disposed on the principal surface 3a. In this case, the first electrode layer E1 included in the electrode portion 5a is formed to cover one part of the principal surface 3a and the entire ridge portion 3g. That is, the first electrode layer E1 included in the electrode portion 5a is also in contact with the one part of the principal surface 3a. The one part of the principal surface 3a is, for example, the partial region near the end surface 3e, in the principal surface 3a.

The second electrode layer E2 included in the electrode portion 5a is disposed on the first electrode layer E1 and on the principal surface 3a. In the electrode portion 5a, the second electrode layer E2 covers the entire first electrode layer E1. In the electrode portion 5a, the second electrode layer E2 is in contact with the entire first electrode layer E1. The second electrode layer E2 included in the electrode portion 5a is in contact with one part of the principal surface 3a. The one part of the principal surface 3a is, for example, the partial region near the end surface 3e, in the principal surface 3a. That is, the one part of the principal surface 3a is close to the end surface 3e. The second electrode layer E2 included in the electrode portion 5a includes a region E2a positioned on the principal surface 3a. The electrode portion 5a is four-layered on the ridge portion 3g, and is three-layered on the principal surface 3a. The second electrode layer E2 included in the electrode portion 5a is formed to cover the one part of the principal surface 3a and the entire ridge portion 3g. As described above, the one part of the principal surface 3a is, for example, the partial region near the end surface 3e, in the principal surface 3a.

The second electrode layer E2 included in the electrode portion 5a indirectly covers the entire ridge portion 3g and the one part of the principal surface 3a in such a manner that the first electrode layer E1 is positioned between the second electrode layer E2 and the element body 3. The second electrode layer E2 included in the electrode portion 5a directly covers the one part of the principal surface 3a. The second electrode layer E2 included in the electrode portion 5a directly covers an entire portion of the first electrode layer E1 formed on the ridge portion 3g. In a case in which the first electrode layer E1 included in the electrode portion 5a is disposed on the principal surface 3a, the electrode portion 5a is four-layered on the principal surface 3a and the ridge portion 3g. In a case in which the first electrode layer E1 included in the electrode portion 5a is disposed on the principal surface 3a, the region E2a of the second electrode layer E2 includes a portion being in contact with the principal surface 3a and a portion being in contact with the first electrode layer E1.

The first electrode layer E1 included in the electrode portion 5b is disposed on the ridge portion 3h, and is not disposed on the principal surface 3b. The first electrode layer E1 included in the electrode portion 5b is formed to cover the entire ridge portion 3h. The first electrode layer E1 is not formed on the principal surface 3b. The first electrode layer E1 included in the electrode portion 5b is in contact with the entire ridge portion 3h. The principal surface 3b is not covered with the first electrode layer E1, and is exposed from the first electrode layer E1. The first electrode layer E1 included in the electrode portion 5b may be disposed on the principal surface 3b. In this case, the first electrode layer E1 included in the electrode portion 5b is formed to cover one part of the principal surface 3b and the entire ridge portion 3h. That is, the first electrode layer E1 included in the electrode portion 5b is also in contact with the one part of the principal surface 3b. The one part of the principal surface 3b is, for example, the partial region near the end surface 3e, in the principal surface 3b. The electrode portion 5b does not include the second electrode layer E2. The principal surface 3b is not covered with the second electrode layer E2, and is exposed from the second electrode layer E2. The second electrode layer E2 is not formed on the principal surface 3b. The electrode portion 5b is three-layered.

The first electrode layer E1 included in the electrode portion 5c is disposed on the ridge portion 3i, and is not disposed on the side surface 3c. The first electrode layer E1 included in the electrode portion 5c is formed to cover the entire ridge portion 3i. The first electrode layer E1 is not formed on the side surface 3c. The first electrode layer E1 included in the electrode portion 5c is in contact with the entire ridge portion 3i. The side surface 3c is not covered with the first electrode layer E1, and is exposed from the first electrode layer E1. The first electrode layer E1 included in the electrode portion 5c may be disposed on the side surface 3c. In this case, the first electrode layer E1 included in the electrode portion 5c is formed to cover one part of the side surface 3c and the entire ridge portion 3i. That is, the first electrode layer E1 included in the electrode portion 5c is also in contact with the one part of the side surface 3c. The one part of the side surface $3c$ is, for example, the partial region near the end surface $3e$, in the side surface $3c$.

The second electrode layer E2 included in the electrode portion $5c$ is disposed on the first electrode layer E1 and on the side surface $3c$. In the electrode portion $5c$, the second electrode layer E2 covers one part of the first electrode layer E1. In the electrode portion $5c$, the second electrode layer E2 is in contact with one part of the side surface $3c$ and the one part of the first electrode layer E1. The second electrode layer E2 included in the electrode portion $5c$ includes a region E2c positioned on the side surface $3c$. The second electrode layer E2 included in the electrode portion $5c$ is formed to cover one part of the ridge portion $3i$ and the one part of the side surface $3c$. The one part of the ridge portion $3i$ is, for example, a partial region near the principal surface $3a$, in the ridge portion $3i$. That is, the one part of the ridge portion $3i$ is close to the principal surface $3a$. The one part of the side surface $3c$ is, for example, a corner region near the principal surface $3a$ and end surface $3e$, in the side surface $3c$. That is, the one part of the side surface $3c$ is close to the principal surface $3a$ and end surface $3e$. The second electrode layer E2 included in the electrode portion $5c$ indirectly covers the one part of the ridge portion $3i$ in such a manner that the first electrode layer E1 is positioned between the second electrode layer E2 and the element body 3. The second electrode layer E2 included in the electrode portion $5c$ indirectly covers the one part of the ridge portion $3i$. The second electrode layer E2 included in the electrode portion $5c$ directly covers the one part of the side surface $3c$. The second electrode layer E2 included in the electrode portion $5c$ directly covers a part of the portion of the first electrode layer E1 formed on the ridge portion $3i$. In a case in which the first electrode layer E1 included in the electrode portion $5c$ is disposed on the side surface $3c$, the region E2c of the second electrode layer E2 includes a portion being in contact with the side surface $3c$ and a portion being in contact with the first electrode layer E1.

The electrode portion $5c$ includes a plurality of regions $5c_1$ and $5c_2$. In the present embodiment, the electrode portion $5c$ includes only two regions $5c_1$ and $5c_2$. The region $5c_2$ is positioned closer to the principal surface $3a$ than the region $5c_1$. The region $5c_1$ includes the first electrode layer E1, the third electrode layer E3, and the fourth electrode layer E4. The region $5c_1$ does not include the second electrode layer E2. The region $5c_1$ is three-layered. The region $5c_2$ includes the first electrode layer E1, the second electrode layer E2, the third electrode layer E3, and the fourth electrode layer E4. The regions $5c_2$ is four-layered on the ridge portion $3i$, and is three-layered on the side surface $3c$. The region $5c_1$ is the region where the first electrode layer E1 is exposed from the second electrode layer E2. The region $5c_2$ is the region where the first electrode layer E1 is covered with the second electrode layer E2. The region $5c_2$ includes the region E2c.

The first electrode layer E1 included in the electrode portion $5e$ is disposed on the end surface $3e$. The end surface $3e$ is entirely covered with the first electrode layer E1. The first electrode layer E1 included in the electrode portion $5e$ is in contact with the entire end surface $3e$. The second electrode layer E2 included in the electrode portion $5e$ is disposed on the first electrode layer E1. In the electrode portion $5e$, one part of the first electrode layer E1 is covered with the second electrode layer E2. In the electrode portion $5e$, the second electrode layer E2 is in contact with the one part of the first electrode layer E1. The second electrode layer E2 included in the electrode portion $5e$ includes a region E2e positioned on the end surface $3e$. The second electrode layer E2 included in the electrode portion $5e$ is formed to cover one part of the end surface $3e$. The one part of the end surface $3e$ is, for example, a partial region near the principal surface $3a$, in the end surface $3e$. That is, the one part of the end surface $3e$ is close to the principal surface $3a$. The second electrode layer E2 included in the electrode portion $5e$ indirectly covers the one part of the side surface $3e$ in such a manner that the first electrode layer E1 is positioned between the second electrode layer E2 and the element body 3. The second electrode layer E2 included in the electrode portion $5e$ directly covers a part of the portion of the first electrode layer E1 formed on the end surface $3e$. In the electrode portion $5e$, the first electrode layer E1 is formed on the end surface $3e$ to be coupled to the one ends of the corresponding internal electrodes 7 or 9.

The electrode portion $5e$ includes a plurality of regions $5e_1$ and $5e_2$. In the present embodiment, the electrode portion $5e$ includes only two regions $5e_1$ and $5e_2$. The region $5e_2$ is positioned closer to the principal surface $3a$ than the region $5e_1$. The region $5e_1$ includes the first electrode layer E1, the third electrode layer E3, and the fourth electrode layer E4. The region $5e_1$ does not include the second electrode layer E2. The region $5e_1$ is three-layered. The region $5e_2$ includes the first electrode layer E1, the second electrode layer E2, the third electrode layer E3, and the fourth electrode layer E4. The third electrode layer E3 and fourth electrode later E4 included in the electrode portion $5e$ are formed to cover the entire end surface $3e$ when viewed from the third direction D3. In the present embodiment, the third electrode layer E3 and fourth electrode later E4 indirectly cover the entire end surface $3e$. The regions $5e_2$ is four-layered. The region $5e_1$ is the region where the first electrode layer E1 is exposed from the second electrode layer E2. The region $5e_2$ is the region where the first electrode layer E1 is covered with the second electrode layer E2. The region $5e_2$ includes the region E2e.

The first electrode layer E1 is formed by sintering conductive paste applied onto a surface of the element body 3. The first electrode layer E1 is formed to cover the end surface $3e$ and the ridge portions $3g$, $3h$, and $3i$. The first electrode layer E1 is formed by sintering a metal component (metal powder) contained in the conductive paste. The first electrode layer E1 includes a sintered metal layer. The first electrode layer E1 includes a sintered metal layer formed on the element body 3. The first electrode layer E1 is not intentionally formed on the pair of principal surfaces $3a$ and $3b$ and the pair of side surfaces $3c$. The first electrode layer E1 may be unintentionally formed on the principal surfaces $3a$ and $3b$ and the side surfaces $3c$ due to a production error, for example. In the present embodiment, the first electrode layer E1 is a sintered metal layer made of Cu. The first electrode layer E1 may be a sintered metal layer made of Ni. The first electrode layer E1 contains a base metal. The conductive paste contains, for example, powder made of Cu or Ni, a glass component, an organic binder, and an organic solvent. The first electrode layer E1 included in the electrode portion $5a$, the first electrode layer E1 included in the electrode portion $5b$, the first electrode layer E1 included in the electrode portion $5c$, and the first electrode layer E1 included in the electrode portion $5e$ are integrally formed.

The second electrode layer E2 is formed by curing conductive resin paste applied onto the first electrode layer E1, the principal surface $3a$, and the pair of side surfaces $3c$. The second electrode layer E2 is formed over the first electrode layer E1 and the element body 3. The first electrode layer E1 is an underlying metal layer for forming the second electrode layer E2. The second electrode layer E2 is a conductive resin layer covering the first electrode layer E1. The second electrode layer E2 includes a conductive resin layer. The conductive resin paste contains, for example, a resin, a conductive material, and an organic solvent. The resin is, for example, a thermosetting resin. The conductive material includes, for example, metal powder. The metal powder includes, for example, Ag powder or Cu powder. The thermosetting resin includes, for example, a phenolic resin, an acrylic resin, a silicone resin, an epoxy resin, or a polyimide resin.

In the present embodiment, the second electrode layer E2 covers a partial region of the first electrode layer E1. The partial region of the first electrode layer E1 includes, for example, the regions corresponding to the electrode portion 5a, the region $5c_2$ of the electrode portion 5c, and the region $5e_2$ of the electrode portion 5e, in the first electrode layer E1. The second electrode layer E2 directly covers a partial region of the ridge portion 3j. The partial region of the ridge portion 3j is, for example, the partial region near the end surface 3e, in the ridge portion 3j. That is, the partial region of the ridge portion 3j is close to the end surface 3e. The second electrode layer E2 is in contact with the partial region of the ridge portion 3j. The second electrode layer E2 included in the electrode portion 5a, the second electrode layer E2 included in the electrode portion 5b, the second electrode layer E2 included in the electrode portion 5c, and the second electrode layer E2 included in the electrode portion 5e are integrally formed.

The third electrode layer E3 is formed on the second electrode layer E2 by plating method. In the present embodiment, the third electrode layer E3 is formed on the second electrode layer E2 by Ni plating. The third electrode layer E3 is a Ni plating layer. The third electrode layer E3 may be an Sn plating layer, a Cu plating layer, or an Au plating layer. The third electrode layer E3 contains Ni, Sn, Cu, or Au. The Ni plating layer has better solder leach resistance than the metal contained in the second electrode layer E2.

The fourth electrode layer E4 is formed on the third electrode layer E3 by plating method. The fourth electrode layer E4 includes a solder plating layer. In the present embodiment, the fourth electrode layer E4 is formed on the third electrode layer E3 by Sn plating. The fourth electrode layer E4 is an Sn plating layer. The fourth electrode layer E4 may be an Sn—Ag alloy plating layer, an Sn—Bi alloy plating layer, or an Sn—Cu alloy plating layer. The fourth electrode layer E4 contains Sn, Sn—Ag alloy, Sn—Bi alloy, or Sn—Cu alloy.

The third electrode layer E3 and the fourth electrode layer E4 constitute a plating layer PL formed on the second electrode layer E2. In the present embodiment, the plating layer PL formed on the second electrode layer E2 is two-layered. The third electrode layer E3 is an intermediate plating layer positioned between the fourth electrode layer E4 arranged to constitute the outermost layer and the second electrode layer E2. The third electrode layer E3 included in the electrode portion 5a, the third electrode layer E3 included in the electrode portion 5b, the third electrode layer E3 included in the electrode portion 5c, and the third electrode layer E3 included in the electrode portion 5e are integrally formed. The fourth electrode layer E4 included in the electrode portion 5a, the fourth electrode layer E4 included in the electrode portion 5b, the fourth electrode layer E4 included in the electrode portion 5c, and the fourth electrode layer E4 included in the electrode portion 5e are integrally formed.

The first electrode layer E1 (first electrode layer E1 included in the electrode portion 5e) is formed on the end surface 3e to be connected to the corresponding internal electrodes 7 or 9. The first electrode layer E1 covers the entire end surface 3e, the entire ridge portion 3g, the entire ridge portion 3h, and the entire ridge portion 3i. The second electrode layer E2 (second electrode layers E2 included in the electrode portions 5a, 5c, and 5e) continuously covers one part of the principal surface 3a, one part of the end surface 3e, and one part of each of the pair of side surfaces 3c. The second electrode layer E2 (second electrode layers E2 included in the electrode portions 5a, 5c, and 5e) covers the entire ridge portion 3g, one part of the ridge portion 3i, and one part of the ridge portion 3j. The second electrode layer E2 includes a plurality of portions each corresponding to the one part of the principal surface 3a, the one part of the end surface 3e, the one part of each of the pair of side surfaces 3c, the entire ridge portion 3g, the one part of the ridge portion 3i, and the one part of the ridge portion 3j. The first electrode layer E1 (first electrode layer E1 included in the electrode portion 5e) is directly connected to the corresponding internal electrodes 7 or 9.

The first electrode layer E1 (first electrode layers E1 included in the electrode portions 5a, 5b, 5c, and 5e) includes a region covered with the second electrode layer E2 (second electrode layers E2 included in the electrode portions 5a, 5c, and 5e), and a region not covered with the second electrode layer E2 (second electrode layers E2 included in the electrode portions 5a, 5c, and 5e). The region not covered with the second electrode layer E2 is a region exposed from the second electrode layer E2. The third electrode layer E3 and the fourth electrode layer E4 cover the region not covered with the second electrode layer E2 in the first electrode layer E1, and the second electrode layer E2.

As illustrated in FIG. 6, when viewed from the first direction D1, the first electrode layer E1 (first electrode layer E1 included in the electrode portion 5a) is entirely covered with the second electrode layer E2. When viewed from the first direction D1, the first electrode layer E1 (first electrode layer E1 included in the electrode portion 5a) is not exposed from the second electrode layer E2.

As illustrated in FIG. 7, when viewed from the second direction D2, a first end region near the principal surface 3a of the first electrode layer E1 is covered with the second electrode layer E2. The first end region of the first electrode layer E1 includes the first electrode layer E1 included in the region $5c_2$. The first end region of the first electrode layer E1 is close to the principal surface 3a. When viewed from the second direction D2, an end edge $Ee_2$ of the second electrode layer E2 crosses an end edge $Ee_1$ of the first electrode layer E1. When viewed from the second direction D2, a second end region near the principal surface 3b of the first electrode layer E1 is exposed from the second electrode layer E2. The second end region of the first electrode layer E1 includes the first electrode layer E1 included in the region $5c_1$. The second end region of the first electrode layer E1 is close to the principal surface 3b.

As illustrated in FIG. 8, when viewed from the third direction D3, a third end region near the principal surface 3a of the first electrode layer E1 is covered with the second electrode layer E2. The third end region of the first electrode layer E1 includes the first electrode layer E1 included in the region $5e_2$. The third end region of the first electrode layer E1 is close to the principal surface 3a. When viewed from the third direction D3, the end edge $Ee_2$ of the second electrode layer E2 is positioned on the first electrode layer E1. When viewed from the third direction D3, a fourth end region near the principal surface 3b of the first electrode layer E1 is exposed from the second electrode layer E2. The fourth end region of the first electrode layer E1 includes the first electrode layer E1 included in the region $5e_1$. The fourth end region of the first electrode layer E1 is close to the principal surface 3b.

In the multilayer capacitor C1, the second electrode layer E2 continuously covers only the one part of the principal surface 3a, only the one part of the end surface 3e, and only the one part of each of the pair of side surfaces 3c. The second electrode layer E2 covers the entire ridge portion 3g, only the one part of the ridge portion 3i, and only the one part of the ridge portion 3j. The portion of the first electrode layer E1 covering the ridge portion 3i is partially exposed from the second electrode layer E2. For example, the first electrode layer E1 included in the region $5c_1$ is exposed from the second electrode layer E2.

As illustrated in FIG. 9, the second electrode layer E2 is disposed to continuously cover a part of the principal surface 3a and a part of the end surface 3e. The second electrode layer E2 includes the region E2e positioned on the end surface 3e, the region E2a positioned on the principal surface 3a, and a region E2g positioned on the ridge portion 3g. The region E2e is the second electrode layer E2 included in the region $5e_2$ of the electrode portion 5e. The region E2a and the region E2g are the second electrode layer E2 included in the electrode portion 5a. A maximum thickness $T_{2a}$ of the region E2a is larger than a maximum thickness $T_{2e}$ of the region E2e. A minimum thickness $T_{2g}$ of the region E2g is smaller than the maximum thickness $T_{2e}$. In a case where the region E2e constitutes the first region, for example, the region E2a constitutes the second region and the region E2g constitutes the third region.

The maximum thickness $T_{2a}$, the maximum thickness $T_{2e}$, and the minimum thickness $T_{2g}$ can be determined, for example, in the following manner.

A cross-sectional photograph of the multilayer capacitor C1 including the second electrode layer E2 of the electrode portions 5a and 5e is obtained. The cross-sectional photograph is obtained, for example, by capturing a cross-section of the multilayer capacitor C1 taken along a plane that is parallel to the pair of side surfaces 3c and is equidistant from the pair of side surfaces 3c. Each of the thicknesses $T_{2a}$, $T_{2e}$, and $T_{2g}$ of the second electrode layer E2 on the obtained cross-sectional photograph is calculated. The maximum thickness $T_{2e}$ is a maximum value of the thickness of the region E2e in the third direction D3. The maximum thickness $T_{2a}$ is a maximum value of the thickness of the region E2a in the first direction D1. The minimum thickness $T_{2g}$ is a minimum value of the thickness of the region E2g. The thickness of the region E2g is, for example, a thickness of the ridge portion 3g in the normal direction.

In the present embodiment, the maximum thickness $T_{2a}$ falls within a range of 10 to 200 μm, the maximum thickness $T_{2e}$ falls within a range of 5 to 150 μm, and the minimum thickness $T_{2g}$ falls within a range of 5 to 100 μm. For example, the maximum thickness $T_{2a}$ is 86 μm, the maximum thickness $T_{2e}$ is 80 μm, and the minimum thickness $T_{2g}$ is 32 μm.

As illustrated in FIG. 9, in a cross-section orthogonal to the principal surface 3a and the end surface 3e, a surface of the region E2a curves in a convex shape in a direction away from the principal surface 3a. The thickness of the region E2a is gradually reduced from a position of the maximum thickness of the region E2a toward an end edge of the region E2a. In the present embodiment, the surface of the region E2a curves due to the change in thickness of the region E2a.

As illustrated in FIG. 6, when viewed from the first direction D1, the end edge $Ee_2$ of the region E2a (the second electrode layer E2) curves. In the present embodiment, when viewed from the first direction D1, a length of the region E2a in the third direction D3 is larger at the center of the region E2a in the second direction D2 than in an end of the region E2a in the second direction D2. The length of the region E2a in the third direction D3 is largest at the center of the region E2a in the second direction D2, and is gradually reduced toward the end of the region E2a in the second direction D2.

As illustrated in FIG. 10, the second electrode layer E2 is disposed to also cover a part of the side surface 3c continuously. The second electrode layer E2 is disposed to continuously cover the part of the principal surface 3a, the part of the end surface 3e, and the part of the side surface 3c. The second electrode layer E2 is disposed to continuously cover only the part of each of the principal surface 3a, the end surface 3e, and the side surface 3c, as described above. The second electrode layer E2 covers the entire ridge portion 3g, a part of the ridge portion 3j, and a part of the ridge portion 3i. The second electrode layer E2 includes a region E2c positioned on the side surface 3c and a region E2i positioned on the ridge portion 3i. The region E2c and the region E2i correspond to the second electrode layer E2 included in the region $5c_2$. A maximum thickness $T_{2c}$ of the region E2c is smaller than the maximum thickness $T_{2e}$. A minimum thickness $T_{2i}$ of the region E2i is smaller than the maximum thickness $T_{2e}$. The maximum thickness $T_{2c}$ and the minimum thickness $T_{2i}$ may be approximately equal to each other. For example, the region E2c constitutes a fourth region.

The maximum thickness $T_{2c}$ and the minimum thickness $T_{2i}$ can be determined, for example, in the following manner.

A cross-sectional photograph of the multilayer capacitor C1 including the second electrode layer E2 of the electrode portion 5c is obtained. The cross-sectional photograph is obtained, for example, by capturing a cross-section of the multilayer capacitor C1 taken along a plane that is parallel to the pair of principal surfaces 3a and passes through the electrode portion 5c. The plane passes through a boundary between the side surface 3c and the ridge portion 3j, for example. Each of the thicknesses $T_{2c}$ and $T_{2i}$ of the second electrode layer E2 on the obtained cross-sectional photograph is calculated. The maximum thickness $T_{2c}$ is a maximum value of the thickness of the region E2c in the second direction D2. The minimum thickness $T_{2i}$ is a minimum value of the thickness of the region E2i. The thickness of the region E2i is, for example, a thickness of the ridge portion 3i in the normal direction.

In the present embodiment, the maximum thickness $T_{2c}$ falls within a range of 10 to 70 μm, and the minimum thickness $T_{2i}$ falls within a range of 5 to 40 μm. For example, the maximum thickness $T_{2c}$ is 40 μm, and the minimum thickness $T_{2i}$ is 20 μm.

The plating layer PL includes the third electrode layer E3 and the fourth electrode layer E4 as described above. The plating layer PL includes a portion PL1 positioned on the region E2a, a portion PL2 positioned on the region E2e, and a portion PL3 positioned on the region E2c. The portion PL1 includes an end edge PL1e. The portion PL3 includes an end edge PL3e. The plating layer PL (the third electrode layer E3 and the fourth electrode layer E4) is away from the element body 3. As illustrated in FIG. 9, a gap 17 is formed between the end edge PL1e and the element body 3 (the principal surface 3a). As illustrated in FIG. 10, a gap 19 is formed between the end edge PL3e and the element body 3 (the side surface 3c). The widths of the gaps 17 and 19 are, for example, larger than 0 (zero) and equal to or smaller than 3 μm. The widths of the gaps 17 and 19 may be the same as each other. The widths of the gaps 17 and 19 may be different from each other. In the present embodiment, the portion PL2 includes no end edge because the entirety of the end surface 3e is covered with the external electrode 5. The first electrode layer E1 and the second electrode layer E2 are positioned between the portion PL2 and the element body 3. Therefore, no gap is formed between the portion PL2 and the element body 3.

The portion PL1 of the plating layer PL tends to be cohesive contact with the region E2a of the second electrode layer E2, but tends not to be cohesive contact with the principal surface 3a. Therefore, the gap 17 is formed between the end edge PL1e of the portion PL1 and the principal surface 3a. Even in a case where the moisture absorbed by the resin is gasified, the gas generated from the moisture reaches the gap 17, and the gas is emitted outside the external electrode 5 through the gap 17. Since the gas generated from the moisture is emitted outside the external electrode 5, stress tends not to act on the second electrode layer E2.

Since the region E2a is close to the gap 17, the gas generated from the moisture absorbed by the resin of the region E2a tends to reach the gap 17. However, the gas generated from the moisture absorbed by the resin of the region E2e tends not to reach the gap 17 since the region E2e is away from the gap 17.

In a configuration where the maximum thickness $T_{2a}$ of the region E2a is larger than the maximum thickness $T_{2e}$ of the region E2e, the gas generated from the moisture absorbed by the resin of the region E2e reaches the gap 17 reliably. In the configuration where the maximum thickness $T_{2a}$ is larger than the maximum thickness $T_{2e}$, the gas generated from the moisture absorbed by the resin of the region E2e tends to move in the region E2a.

Since the maximum thickness $T_{2a}$ is larger than the maximum thickness $T_{2e}$ in the multilayer capacitor C1, the gas generated from the moisture absorbed by the resin of the region E2e reaches the gap 17 reliably. In a case in which the gas generated from the moisture absorbed by the resin of the region E2e reaches the gap 17 reliably, the gas generated from the moisture absorbed by the resin of the region E2a also reaches the gap 17 reliably. The gas that has reached the gap 17 is emitted outside the external electrode 5, so that the stress tends not to act on the second electrode layer E2. Consequently, the multilayer capacitor C1 controls peel-off of the second electrode layer E2 reliably.

In the multilayer capacitor C1, the minimum thickness $T_{2g}$ of the region E2g is smaller than the maximum thickness $T_{2e}$.

The gap 17 is an outlet of the gas generated from the moisture absorbed by the resin of the region E2e, and is also an inlet for the moisture to the external electrode 5. The path through which the gas generated from the moisture absorbed by the resin of the region E2e reaches the gap 17 may serve as a path through which the moisture reaches the region E2e. The moisture that has reached the region E2e is absorbed in the region E2e. In this case, the gas generation amount may increase.

In a configuration where the minimum thickness $T_{2g}$ of the region E2g is smaller than the maximum thickness $T_{2e}$, the moisture tends not to reach the region E2e. In the configuration where the minimum thickness $T_{2g}$ is smaller than the maximum thickness $T_{2e}$, the moisture tends not to pass through the region E2g. Therefore, the multilayer capacitor C1 reduces an increase in moisture absorbed in the region E2e and an increase in gas generated from the moisture. Consequently, the multilayer capacitor C1 controls the peel-off of the second electrode layer E2 more reliably.

In the multilayer capacitor C1, the maximum thickness $T_{2c}$ of the region E2c is smaller than the maximum thickness $T_{2e}$.

In a configuration where the maximum thickness $T_{2c}$ of the region E2c is smaller than the maximum thickness $T_{2e}$, the gas generated from the moisture absorbed by the resin of the region E2e tends not to pass through the region E2c. Therefore, the gas generated from the moisture absorbed by the resin of the region E2e reaches the gap 17 through the region E2a more reliably. Consequently, the multilayer capacitor C1 controls a position from which the gas is emitted.

Since the region E2c is closer to the gap 19 than to the region E2e, the region E2c may serve as a path through which the moisture reaches the region E2e. In the configuration where the maximum thickness $T_{2c}$ is smaller than the maximum thickness $T_{2e}$, even in a case in which the moisture enters the region E2c, the moisture tends not to pass through the region E2c. Therefore, the multilayer capacitor C1 reduces the increase in moisture absorbed in the region E2e and the increase in gas generated from the moisture even in a case in which the second electrode layer E2 includes the region E2c. Consequently, the multilayer capacitor C1 controls the peel-off of the second electrode layer E2 more reliably.

In the multilayer capacitor C1, in the cross-section orthogonal to the principal surface 3a and the end surface 3e, the surface of the region E2a curves in the convex shape in the direction away from the principal surface 3a.

In the configuration where the surface of the region E2a curves in the convex shape in the direction away from the principal surface 3a, since the thickness of the region E2a tends not to be small locally, a movement path of the gas in the region E2a tends not to be narrow on the movement path. Therefore, the multilayer capacitor C1 tends not to suppress the movement of the gas in the region E2a. The gas generated from the moisture absorbed by the resin of the second electrode layer E2 reaches the gap 17 more reliably. Consequently, the multilayer capacitor C1 controls the peel-off of the second electrode layer E2 more reliably.

In the multilayer capacitor C1, when viewed from the first direction D1, the end edge $Ee_2$ of the region E2a curves.

In the configuration where the end edge $Ee_2$ of the region E2a curves, the length of the end edge $Ee_2$ of the region E2a is larger than that of a configuration where the end edge $Ee_2$ of the region E2a has a linear shape. Therefore, in the multilayer capacitor C1, a region from which the gas is emitted is large, and the gas further tends to be emitted from the external electrode 5. Consequently, the stress further tends not to act on the second electrode layer E2.

In the present specification, in a case in which an element is described as being disposed on another element, the element may be directly disposed on the other element or be indirectly disposed on the other element. In a case in which an element is indirectly disposed on another element, an intervening element is present between the element and the other element. In a case in which an element is directly disposed on another element, no intervening element is present between the element and the other element.

In the present specification, in a case in which an element is described as being positioned on another element, the element may be directly positioned on the other element or be indirectly positioned on the other element. In a case in which an element is indirectly positioned on another element, an intervening element is present between the element and the other element. In a case in which an element is directly positioned on another element, no intervening element is present between the element and the other element.

In the present specification, in a case in which an element is described as covering another element, the element may directly cover the other element or indirectly cover the other element. In a case in which an element indirectly covers another element, an intervening element is present between the element and the other element. In a case in which an element directly covers another element, no intervening element is present between the element and the other element.

Although the embodiment of the present invention have been described above, the present invention is not necessarily limited to the embodiment, and the embodiment can be variously changed without departing from the scope of the invention.

The minimum thickness $T_{2g}$ may be equal to or larger than the maximum thickness $T_{2e}$. In a case where the minimum thickness $T_{2g}$ is smaller than the maximum thickness $T_{2e}$, the multilayer capacitor C1 controls the peel-off of the second electrode layer E2 more reliably as described above.

The maximum thickness $T_{2c}$ may be equal to or larger than the maximum thickness $T_{2e}$. In a case where the maximum thickness $T_{2c}$ is smaller than the maximum thickness $T_{2e}$, the multilayer capacitor C1 controls the position from which the gas is emitted, and controls the peel-off of the second electrode layer E2 more reliably as described above.

In a cross-section orthogonal to the principal surface 3a and the end surface 3e, the surface of the region E2a may not curve in a convex shape in a direction away from the principal surface 3a. In a case where, in the cross-section orthogonal to the principal surface 3a and the end surface 3e, the surface of the region E2a curves in a convex shape in a direction away from the principal surface 3a, the multilayer capacitor C1 controls the peel-off of the second electrode layer E2 more reliably as described above.

When viewed from the first direction D1, the end edge $Ee_2$ of the region E2a may not curve. In a case where, when viewed from the first direction D1, the end edge $Ee_2$ of the region E2a curves, the stress further tends not to act on the second electrode layer E2 as described above.

The first electrode layer E1 may be formed on the principal surface 3a to extend from the end surface 3e beyond the entire ridge portion 3g or a part of the ridge portion 3g. The first electrode layer E1 may be formed on the principal surface 3b to extend from the end surface 3e beyond the entire ridge portion 3h or a part of the ridge portion 3h. The first electrode layer E1 may be formed on the side surface 3c to extend from the end surface 3e beyond the entire ridge portion 3i or a part of the ridge portion 3i.

The electronic component of the present embodiment is the multilayer capacitor. Applicable electronic component is not limited to the multilayer capacitor. Examples of the applicable electronic components include, but not limited to, multilayer electronic components such as a multilayer inductor, a multilayer varistor, a multilayer piezoelectric actuator, a multilayer thermistor, or a multilayer composite component, and electronic components other than the multilayer electronic components.

What is claimed is:

1. An electronic component comprising:
   an element body including a principal surface arranged to constitute a mounting surface and an end surface adjacent to the principal surface;
   and an external electrode disposed on the element body, wherein the external electrode includes a conductive resin layer disposed to
   continuously cover a part of the principal surface and a part of the end surface, and a plating layer covering the conductive resin layer,
   the conductive resin layer includes a first region positioned on the end surface and a second region positioned on the principal surface,
   a maximum thickness of the second region is larger than a maximum thickness of the first region, a gap is formed between an end edge of the plating layer and the principal surface, and a width of the gap formed between the end edge of the plating layer and the principal surface is equal to or smaller than 3 µm.

2. The electronic component according to claim 1, wherein
   the conductive resin layer further includes a third region positioned on a ridge portion between the end surface and the principal surface, and
   a minimum thickness of the third region is smaller than the maximum thickness of the first region.

3. The electronic component according to claim 1, wherein
   the element body further includes a side surface, the side surface being adjacent to the principal surface and the end surface,
   the conductive resin layer is disposed to cover also a part of the side surface continuously, and further includes a fourth region positioned on the side surface,
   a maximum thickness of the fourth region is smaller than the maximum thickness of the first region, and
   a gap is formed between an end edge of the plating layer and the side surface.

4. The electronic component according to claim 1, wherein, in a cross-section orthogonal to the principal surface and the end surface, a surface of the second region curves in a convex shape in a direction away from the principal surface.

5. The electronic component according to claim 1, wherein, when viewed from a direction orthogonal to the principal surface, an end edge of the second region curves.

6. An electronic component comprising:
   an element body including a principal surface arranged to constitute a mounting surface and an end surface adjacent to the principal surface; and
   an external electrode disposed on the element body, wherein
   the external electrode includes a conductive resin layer disposed to continuously cover a part of the principal surface and a part of the end surface, and a plating layer covering the conductive resin layer,
   the conductive resin layer includes a first region positioned on the end surface and a second region positioned on the principal surface,
   a maximum thickness of the second region is larger than a maximum thickness of the first region,
   the conductive resin layer further includes a third region positioned on a ridge portion between the end surface and the principal surface, and a minimum thickness of the third region is smaller than the maximum thickness of the first region.

7. The electronic component according to claim 6, wherein
the element body further includes a side surface, the side surface being adjacent to the principal surface and the end surface,
the conductive resin layer is disposed to cover also a part of the side surface continuously, and further includes a fourth region positioned on the side surface, and
a maximum thickness of the fourth region is smaller than the maximum thickness of the first region.

8. The electronic component according to claim 6, wherein, in a cross-section orthogonal to the principal surface and the end surface, a surface of the second region curves in a convex shape in a direction away from the principal surface.

9. The electronic component according to claim 6, wherein, when viewed from a direction orthogonal to the principal surface, an end edge of the second region curves.

10. An electronic component comprising:
an element body including a principal surface arranged to constitute a mounting surface and an end surface adjacent to the principal surface; and
an external electrode disposed on the element body, wherein
the external electrode includes a conductive resin layer disposed to continuously cover a part of the principal surface and a part of the end surface, and a plating layer covering the conductive resin layer,
the conductive resin layer includes a first region positioned on the end surface and a second region positioned on the principal surface,
a maximum thickness of the second region is larger than a maximum thickness of the first region,
the element body further includes a side surface, the side surface being adjacent to the principal surface and the end surface,
the conductive resin layer is disposed to cover also a part of the side surface continuously, and further includes a fourth region positioned on the side surface, and
a maximum thickness of the fourth region is smaller than the maximum thickness of the first region.

11. The electronic component according to claim 10, wherein, in a cross-section orthogonal to the principal surface and the end surface, a surface of the second region curves in a convex shape in a direction away from the principal surface.

12. The electronic component according to claim 10, wherein, when viewed from a direction orthogonal to the principal surface, an end edge of the second region curves.

13. The electronic component according to claim 3, wherein a width of the gap formed between the end edge of the plating layer and the side surface is equal to or smaller than 3 μm.

* * * * *